(12) United States Patent
Chen et al.

(10) Patent No.: US 8,497,203 B2
(45) Date of Patent: Jul. 30, 2013

(54) SEMICONDUCTOR STRUCTURES AND METHODS OF MANUFACTURE

(75) Inventors: Fen Chen, Williston, VT (US); Zhong-Xiang He, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 12/856,212

(22) Filed: Aug. 13, 2010

(65) Prior Publication Data

US 2012/0038037 A1 Feb. 16, 2012

(51) Int. Cl.
*H01L 21/4703* (2006.01)

(52) U.S. Cl.
USPC ............ 438/619; 438/622; 438/624; 257/334

(58) Field of Classification Search
USPC .......................... 438/619, 622, 624
See application file for complete search history.

(56) References Cited

U.S. PATENT DOCUMENTS

| | | |
|---|---|---|
| 4,692,843 A | 9/1987 | Matsumoto et al. |
| 6,064,118 A | 5/2000 | Sasaki |
| 6,102,581 A | 8/2000 | Deveau et al. |
| 6,104,856 A | 8/2000 | Lampert |
| 6,165,890 A | 12/2000 | Kohl et al. |
| 6,204,165 B1 | 3/2001 | Ghoshal |
| 6,214,719 B1 | 4/2001 | Nag |
| 6,228,763 B1 | 5/2001 | Lee |
| 6,303,487 B1 | 10/2001 | Kagamihara |
| 6,329,279 B1 | 12/2001 | Lee |
| 6,368,939 B1 | 4/2002 | Sasaki |
| 6,524,948 B2 | 2/2003 | Tamaoka et al. |
| 6,610,593 B2 | 8/2003 | Kohl et al. |
| 6,645,850 B2 | 11/2003 | Leuschner et al. |
| 6,696,315 B2 | 2/2004 | Leuschner et al. |
| 6,734,095 B2 | 5/2004 | Leuschner et al. |
| 6,762,120 B2 | 7/2004 | Nakagawa et al. |
| 6,780,753 B2 | 8/2004 | Latchford et al. |
| 6,838,354 B2 | 1/2005 | Goldberg et al. |
| 6,888,249 B2 | 5/2005 | Kohl et al. |
| 6,905,938 B2 | 6/2005 | Yang et al. |
| 6,917,109 B2 | 7/2005 | Lur et al. |
| 6,933,822 B2 | 8/2005 | Haugs et al. |

(Continued)

FOREIGN PATENT DOCUMENTS

| | | |
|---|---|---|
| JP | 2009135172 | 6/2009 |
| KR | 2008030292 | 4/2008 |

*Primary Examiner* — Howard Weiss
*Assistant Examiner* — Steven Rao
(74) *Attorney, Agent, or Firm* — Anthony Canale; Roberts Mlotkowski Safran & Cole, P.C.

(57) ABSTRACT

Semiconductor structures with airgaps and/or metal linings and methods of manufacture are provided. The method of forming an airgap in a wiring level includes forming adjacent wires in a dielectric layer. The method further includes forming a masking layer coincident with the adjacent wire and forming a first layer on the masking layer to reduce a size of an opening formed in the masking layer between the adjacent wires. The method further includes removing exposed portions of the first layer and the dielectric layer to form trenches between the adjacent wires. The method further includes forming an interlevel dielectric layer upon the dielectric layer, where the interlevel dielectric layer is pinched off from filling the trenches so that an airgap is formed between the adjacent wires. A metal liner can also be formed in the trenches, prior to the formation of the airgap.

23 Claims, 5 Drawing Sheets

U.S. PATENT DOCUMENTS

| | | |
|---|---|---|
| 6,995,470 B2 | 2/2006 | Ahn et al. |
| 7,033,926 B2 | 4/2006 | Schindler et al. |
| 7,041,571 B2 | 5/2006 | Strane |
| 7,071,532 B2 | 7/2006 | Geffken et al. |
| 7,091,611 B2 | 8/2006 | Ahn et al. |
| 7,098,476 B2 | 8/2006 | Babich et al. |
| 7,098,544 B2 | 8/2006 | Edelstein et al. |
| 7,125,782 B2 | 10/2006 | Knorr et al. |
| 7,138,329 B2 | 11/2006 | Lur et al. |
| 7,253,042 B2 | 8/2007 | Disney |
| 7,253,095 B2 * | 8/2007 | Lur et al. ............... 438/619 |
| 7,262,503 B2 | 8/2007 | Juengling et al. |
| 7,262,505 B2 | 8/2007 | Ahn et al. |
| 7,271,085 B2 | 9/2007 | Ahn |
| 7,273,770 B2 | 9/2007 | Edelstein et al. |
| 7,285,889 B2 | 10/2007 | Shkondin |
| 7,301,107 B2 | 11/2007 | Karthikeyan et al. |
| 7,304,388 B2 | 12/2007 | Dubin et al. |
| 7,309,649 B2 | 12/2007 | Colburn et al. |
| 7,319,274 B2 | 1/2008 | Beyer et al. |
| 7,329,602 B2 | 2/2008 | Wise et al. |
| 7,338,896 B2 | 3/2008 | Vanhaelemeersch et al. |
| 7,358,148 B2 | 4/2008 | Geffken et al. |
| 7,439,172 B2 * | 10/2008 | Clevenger et al. ............ 438/619 |
| 2002/0011673 A1 | 1/2002 | Uzoh |
| 2006/0160353 A1 | 7/2006 | Gueneau de Mussy et al. |
| 2006/0223301 A1 | 10/2006 | Vanhaelemeersch et al. |
| 2008/0026541 A1 | 1/2008 | Edelstein et al. |
| 2009/0072409 A1 | 3/2009 | Nitta et al. |
| 2009/0298282 A1 | 12/2009 | Yun et al. |

* cited by examiner

SEMICONDUCTOR STRUCTURES AND METHODS OF MANUFACTURE

FIELD OF THE INVENTION

The invention relates to semiconductor structures and methods of manufacture and, more particularly, to semiconductor structures with airgaps and/or metal linings and airgaps, and methods of manufacture.

BACKGROUND

One of many factors limiting integrated circuit (IC) chip performance is the BEOL parasitic coupling between metal wires. Capacitive coupling is often unintended, such as the capacitance between two wires that are next to each other. Often one signal can capacitively couple with another and cause what appears to be noise. To reduce coupling, wires are often separated as much as possible.

In an effort to reduce the BEOL (back end of line) parasitic coupling between metal wires, much effort has been devoted to lower the dielectric constant of BEOL ILD (interlevel dielectric) films. For example, to minimize the back-end-of-line (BEOL) interconnect portion of circuit delay, the conventional $SiO_2$ dielectric (dielectric constant, k=4.0) has been replaced with dense lower-k films (k<3.0). However, for further performance improvement, more parasitic capacitance reduction is required (k<2.5) for high-speed circuits. This has been accomplished using porous low k dielectrics. However, most of the porous materials have relatively weak mechanical properties as compared to dense dielectrics. It is also difficult to integrate these materials with other BEOL module processes. For example, the conventional chemical-mechanical polish process has difficulty in polishing porous dielectric, and the conventional physical vapor deposition (PVD) diffusion barrier deposition technology cannot offer reasonable coverage on the surface of porous dielectrics. On the other hand, due to the adoption of lower-k dielectrics, the long-term reliability of such materials is rapidly becoming one of the most critical challenges for technology development and qualification. Low-k TDDB is commonly considered a critical issue because low-k materials generally have weaker intrinsic breakdown strength than traditional $SiO_2$ dielectrics. This problem is further exacerbated by the aggressive shrinking of the interconnect pitch size due to continuous technology scaling.

Accordingly, there exists a need in the art to overcome the deficiencies and limitations described hereinabove.

SUMMARY

In a first aspect of the invention, a method of forming an airgap in a wiring level comprises forming adjacent wires in a dielectric layer. The method further comprises forming a masking layer coincident with the adjacent wire. The method further comprises forming a first layer on the masking layer to reduce a size of an opening formed in the masking layer between the adjacent wires. The method further comprises removing exposed portions of the first layer and the dielectric layer to form trenches between the adjacent wires. Portions of the dielectric layer remain on sidewalls of the adjacent wires due to masking of the first layer. The method further comprises opening the trenches towards the adjacent wires. The method further comprises forming an interlevel dielectric layer upon the dielectric layer, wherein the interlevel dielectric layer is pinched off from filling the trenches so that an airgap is formed between the adjacent wires.

In another aspect of the invention, a method of forming an airgap in a wiring level comprises forming adjacent wires in a dielectric layer. The method further comprises forming an inverse masking pattern on the adjacent wires that has a spacing matching a minimum spacing between the adjacent wires. The method further comprises forming a first layer on the inverse masking pattern to reduce a size of an opening formed in the masking layer between the adjacent wires. The method further comprises forming trenches between the adjacent wires by etching the first layer and the dielectric layer. The method further comprises forming a liner on sidewalls of the trenches. The method further comprises forming an interlevel dielectric layer upon the dielectric layer. The interlevel dielectric layer is pinched off from filling the trenches so that an airgap is formed between the liner on the sidewalls.

In yet another aspect of the invention, a structure comprises adjacent wires in a dielectric layer, each of which includes a capping layer. The structure further comprises metal liners formed near sidewalls of the adjacent wires. The structure further comprises an intra-level airgap formed in the dielectric layer between the metal liners. The structure further comprises interlevel dielectric layer formed on the dielectric layer, wherein the interlevel dielectric layer is pinched off, which forms the airgaps.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structure with airgap and liner, which comprises the structures of the present invention. In still further embodiments, a method in a computer-aided design system is provided for generating a functional design model of the semiconductor structure with airgap and liner. The method comprises generating a functional representation of the structural elements of the semiconductor structure with airgap and liner.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to semiconductor structures with intra-level airgaps and/or metal linings and intra-level airgaps, and methods of manufacture. More specifically, the present invention relates to methods and structures for copper wire formation with reduced parasitic coupling, enhanced electro-migration, and improved dielectric time dependent dielectric breakdown (TDDB). For example, the structures of the present invention provide enhanced electro-migration properties which, in embodiments, are critical for SiGe technology. The present invention also advantageously provides lower parasitic coupling needed to reduce cross talk (e.g., lower noise), which enables a faster digital circuit. The present invention provides TDDB improvement for advanced Cu back end of line (BEOL) processes. Due to the metal shielding, the electric field across two active interconnects with different voltage nets could be reduced and multiple breakdowns could be sustained. Furthermore, with airgap between two interconnects, no diffusion path for Cu migration between two interconnects and no interface leakage path for high leakage current generation exist, therefore, further TDDB reliability and chip performance improvements could be achieved. In addition, the present invention also offers higher speed for higher operating current at, for example, peak frequency Ft since higher operating voltages and currents could be used without the compromises of reliability and cross-talk.

In embodiments, the structures of the present invention can include, for example, metal wiring (copper) with a capping layer and airgap within an intra-level dielectric. The airgap can be formed with optical lithography, using a sacrificial spacer, and pullback process. The airgaps can also be formed with or without metallic shielding. Advantageously, the processes of the present invention permit airgaps to be formed within the minimum spacing between metal wires or contacts. The airgaps can be, for example, formed in 22 nm and smaller technology nodes, as a resist layer can be used that has a same width dimension as the underlying metal wires or contacts. That is, the resist does not have a sub minimal spacing, as in conventional processes.

More specifically, unlike conventional processes and structures, the size of the airgap is no longer limited by the lithographic dimension. For example, in the present invention, the mask is no longer larger than the underlying metal wire dimensions, e.g., there is overhang of the mask with respect to the underlying metal wires. Instead, using the methods of the present invention, the mask has the same critical dimensions (e.g., width) as the underlying metal wires and thereby allows trenches to be formed between adjacent metal wires. The present invention thus provides great advantages in that airgaps can now be reliably formed in smaller technology nodes, e.g., 32 nm and smaller.

As discussed in more detail below, in embodiments, the method utilizes a conformal organic film coating (such as ARC film) to reduce the critical dimension of airgap below lithographic limit. For example, the processes of the invention include, for example, deposition of a metal cap layer over a copper or other metal wire formed in a dielectric layer. A dielectric etch stop layer can be deposited on the metal cap layer. A resist, for example, can be formed over the dielectric etch stop layer, using ground rule lithography with an inverse mask. This enables the resist to have the same dimensions as the copper or other metal wire. A conformal layer can be deposited over the inverse pattern to form a spacer for CD reduction. A reactive ion etch can be used to form a trench between the copper or other metal wires. A selective pullback process is then performed, and an interlevel dielectric (ILD) is deposited to form the intra-level airgaps. In embodiments, a liner can be used, instead of the pullback process.

Figure 1:
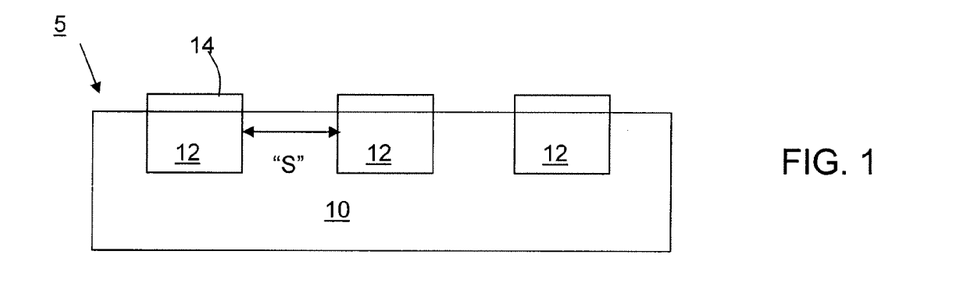
FIGS. 1-7 show semiconductor structures and methods of manufacture in accordance with aspects of the invention.

More specifically, FIG. 1 shows a structure 5 comprising a low k or ultra low k dielectric material 10. A plurality of metal wires or contacts 12 is formed in the material 10 using, for example, conventional lithographic and etching processes. In embodiments, the metal wires or contacts 12 can be copper, gold or silver, for example. In embodiments, the dimensions of the metal wires or contacts 12 and spacing "S" between the metal wires or contacts 12 vary depending on the technology node. For example, the width of each of the metal wires or contacts 12 can be about 50 nm for a 32 nm node technology. In this technology node, the spacing "S" can also be about 50 nm. This results in a 100 nm pitch. As another example, the width of each of the metal wires or contacts 12 can be about 40 nm for a 22 nm node technology. In this technology node, the spacing "S" can also be about 40 nm. This results in an 80 nm pitch.

In embodiments, a selective capping layer 14 is deposited on the metal wires or contacts 12. In embodiments, the selective capping layer 14 can be, for example, CoWP or TaN/TiN. In embodiments, the selective capping layer 14 is deposited using an electroless plating technique known to those of skill in the art. For example, electroless plating is a chemical reduction process which depends upon the catalytic reduction process of metal ions in an aqueous solution (containing a chemical reducing agent) and the subsequent deposition of metal without the use of electrical energy. The electroless plating allows the selective capping layer 14 to be deposited only on the metal wires or contacts 12.

Figure 2:
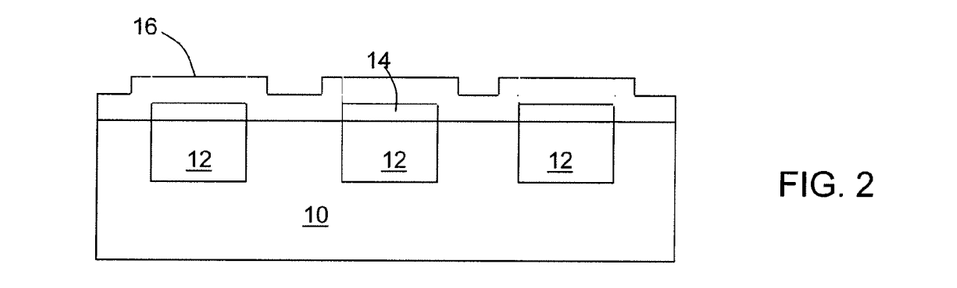

As shown in FIG. 2, a dielectric layer 16 is deposited on the structure. More specifically, the dielectric layer 16 is deposited on the selective capping layer 14 and exposed portions of the dielectric material 10. In embodiments, the dielectric layer 16 can be, for example, an etch stop layer such as, for example n-Block/SiCN or $Si_3N_4$.

Figure 3:
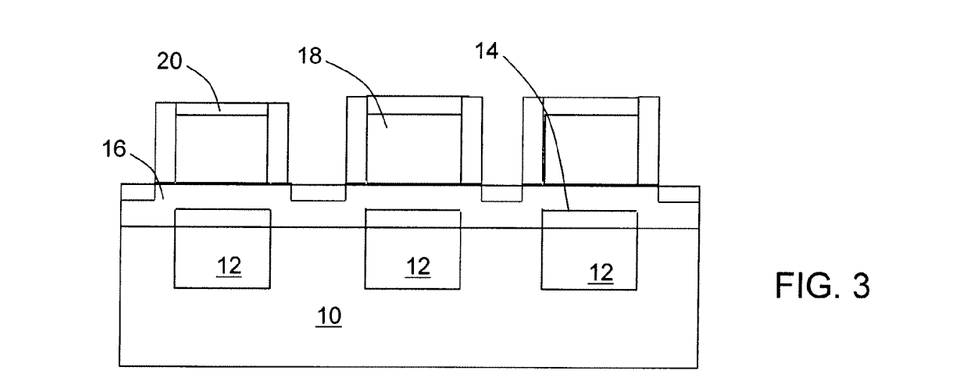

In FIG. 3, a masking layer 18 is formed over the dielectric layer 16. More specifically, the masking layer 18 can be a photoresist or hardmask formed over the metal wires or contacts 12 using the same ground rules as the metal wires or contacts 12, e.g., forming a masking layer coincident with the wires or contacts 12. More specifically, the masking layer 18 can have an inverse masking pattern that has the same width dimensions as the metal wires or contacts 12. Also, this results in a same spacing as between the metal wires or contacts 12.

In embodiments, the masking layer 18 can be a hardmask such as, for example, low temperature oxide (LTO) such as, for example, $SiO_2$. The hardmask can be formed in the inverse masking pattern using conventional lithographic and etching processes. In further embodiments, the masking layer 18 can be photoresist, for example, organic anti-reflective coating (ARC). In the implementation of a photoresist, a lithography processes (e.g., exposure to light) can be used to form an inverse pattern to form a spacer for CD reduction, e.g., to pattern the photoresist for the minimum ground rule. In the implementation of a hardmask, a RIE process can be used to form an inverse pattern to form a spacer for CD reduction, e.g., to pattern the hardmask for the minimum ground rule.

Still referring to FIG. 3, in further embodiments, a sacrificial spacer layer 20 is formed on the structure, including on the masking layer 18 and exposed dielectric layer 16. The sacrificial spacer layer 20 can also be LTO or organic ARC, in embodiments.

Figure 4:
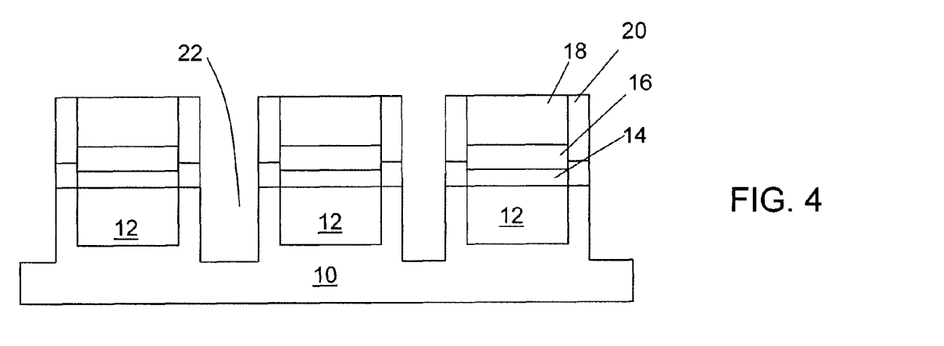

In FIG. 4, a RIE process is performed to form trenches 22 between the metal wires or contacts 12. The trenches 22 may be about one half (½) the minimum ground rule spacing, e.g., 20 nm for a 22 nm technology node. The RIE process can include, for example, a spacer etch (e.g., etch of the sacrificial spacer layer 20) in addition to an etching of the dielectric layer 16 and dielectric material 10, between the wires or contacts 12.

Figure 5:
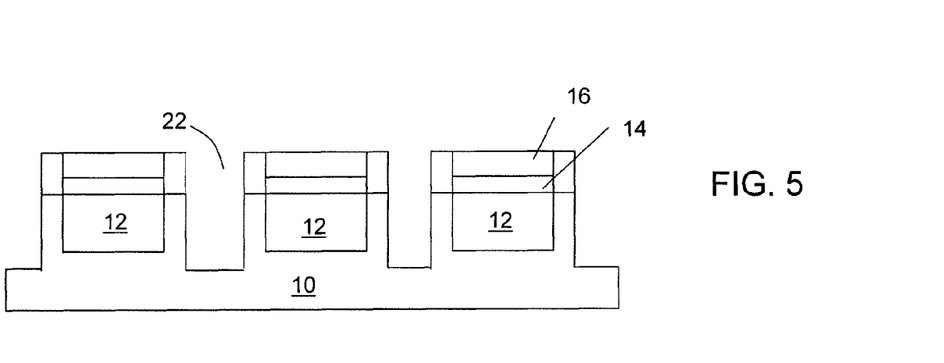
Figure 6:
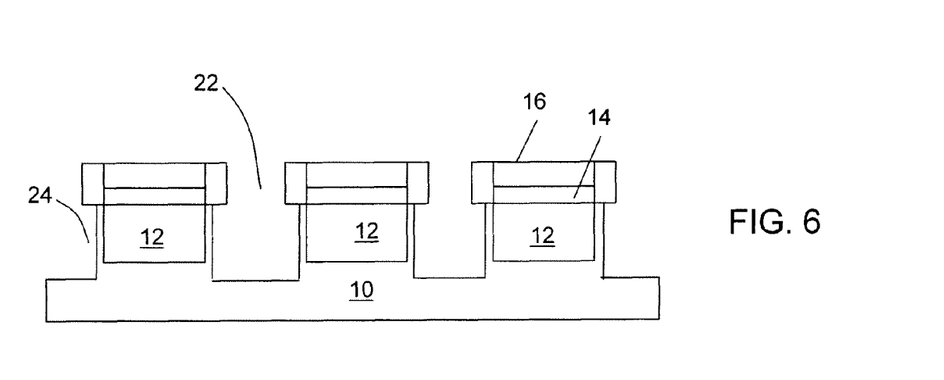

As shown in FIG. 5, the remaining portions of the sacrificial spacer layer 20 and photoresist or hardmask 18 are etched or stripped using conventional etchants. In FIG. 6, a pullback process is performed to widen the trenches 22. More specifically, a fluorine based dry or wet etch chemistry is used to open the trenches, as represented by the undercut 24. In embodiments, the fluorine based dry or wet etch chemistry is selective to the dielectric layer 16, leaving about 5 nm of the dielectric material 10 (spanning from between the metal wires or contacts 12 and trenches 22), e.g., thereby removing substantially all of the dielectric material 10. In this way, the dielectric material 10 can be pulled back towards the wires or contacts 12.

Figure 7:
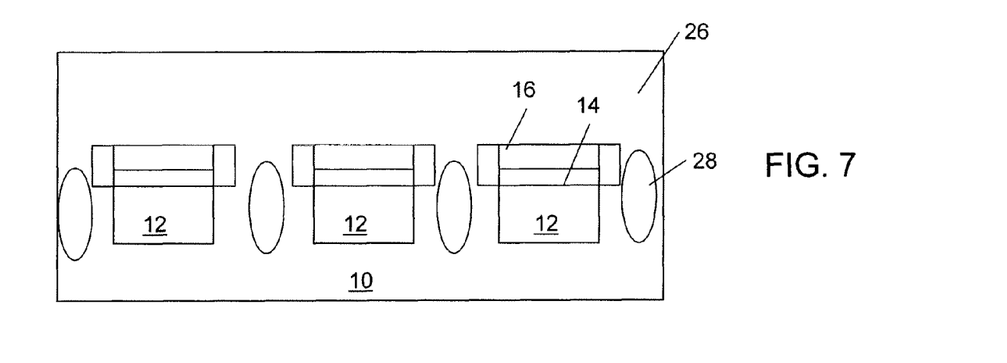

In FIG. 7, a dielectric film 26 is deposited on the structure. In embodiments, the deposition of the dielectric film 26 will form the airgaps 28 between the metal wires or contacts 12. More specifically, during the deposition process, the dielectric film 26, e.g., interlevel dielectric layer, is pinched off from filling the trenches so that an airgap 28 is formed between the adjacent metal wires or contacts 12. In embodiments, the airgaps 28 are intra-level airgaps.

Figure 8:
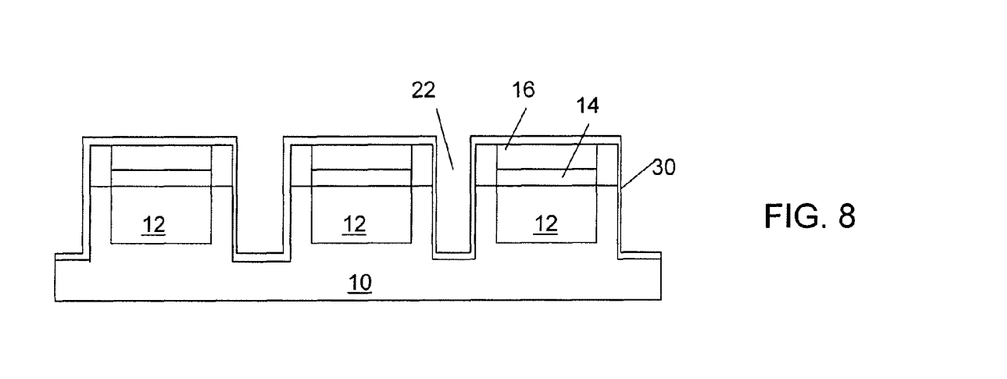
FIGS. 8-11 show semiconductor structures and methods of manufacture in accordance with additional aspects of the invention.

FIG. 8 represents further processing steps and structure to form another aspect of the present invention. Starting from the structure of FIG. 5, a metal layer 30 is deposited over the structure. More specifically, the metal layer 30 is deposited within the trenches 22 and on the dielectric layer 16. The metal layer 30 can be, for example, a TiN or Ta metal deposited using an atomic layer deposition process. In embodiments, the metal layer 30 can advantageously be very thin, i.e., on the order of about 1 nm to 10 nm in thickness.

Figure 9:
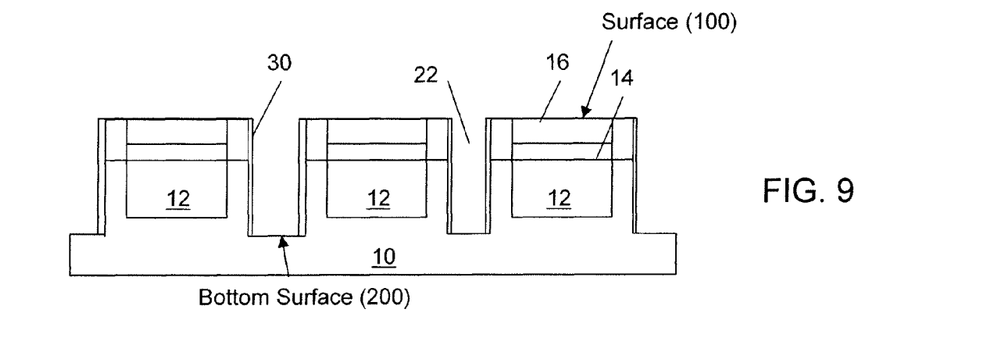

In FIG. 9, portions of the metal layer 30 are etched using an anisotropic etching process. More specifically, the metal layer 30 is stripped on a bottom surface 200 of the trenches 22 and on top (surface 100) of the dielectric layer 16, leaving vertical sidewalls of the metal layer 30.

Figure 10:
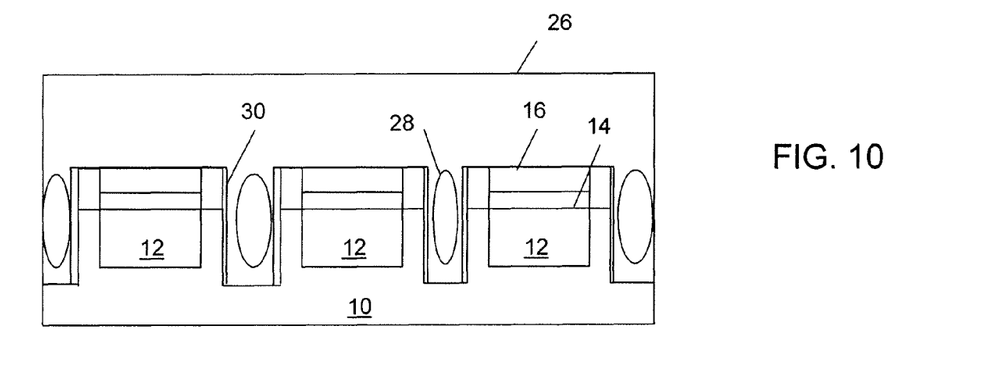

In FIG. 10, a dielectric film 26 is deposited on the structure. In embodiments, the deposition of the dielectric film 26 will form the airgaps 28 between the metal wires or contacts 12. In this embodiment, the airgaps 28 are also between the metal layers 30 that were lining the trenches. In embodiments, the airgaps 28 are intra-level airgaps. In embodiments, the airgaps 28 are intra-level airgaps. More specifically, during the deposition process, the dielectric film 26, e.g., interlevel dielectric layer, is pinched off from filling the trenches so that an airgap 28 is formed between the adjacent metal wires or contacts 12.

Figure 11:
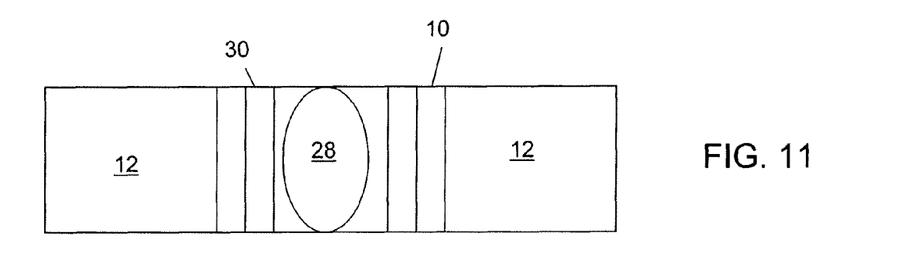

FIG. 11 is a top view of FIG. 10. More specifically, FIG. 11 shows the intra-level airgaps 28 between the metal layers 30. In addition, dielectric material 10 is provided between the metal layers 30 and the metal wires or contacts 12.

Figure 12:
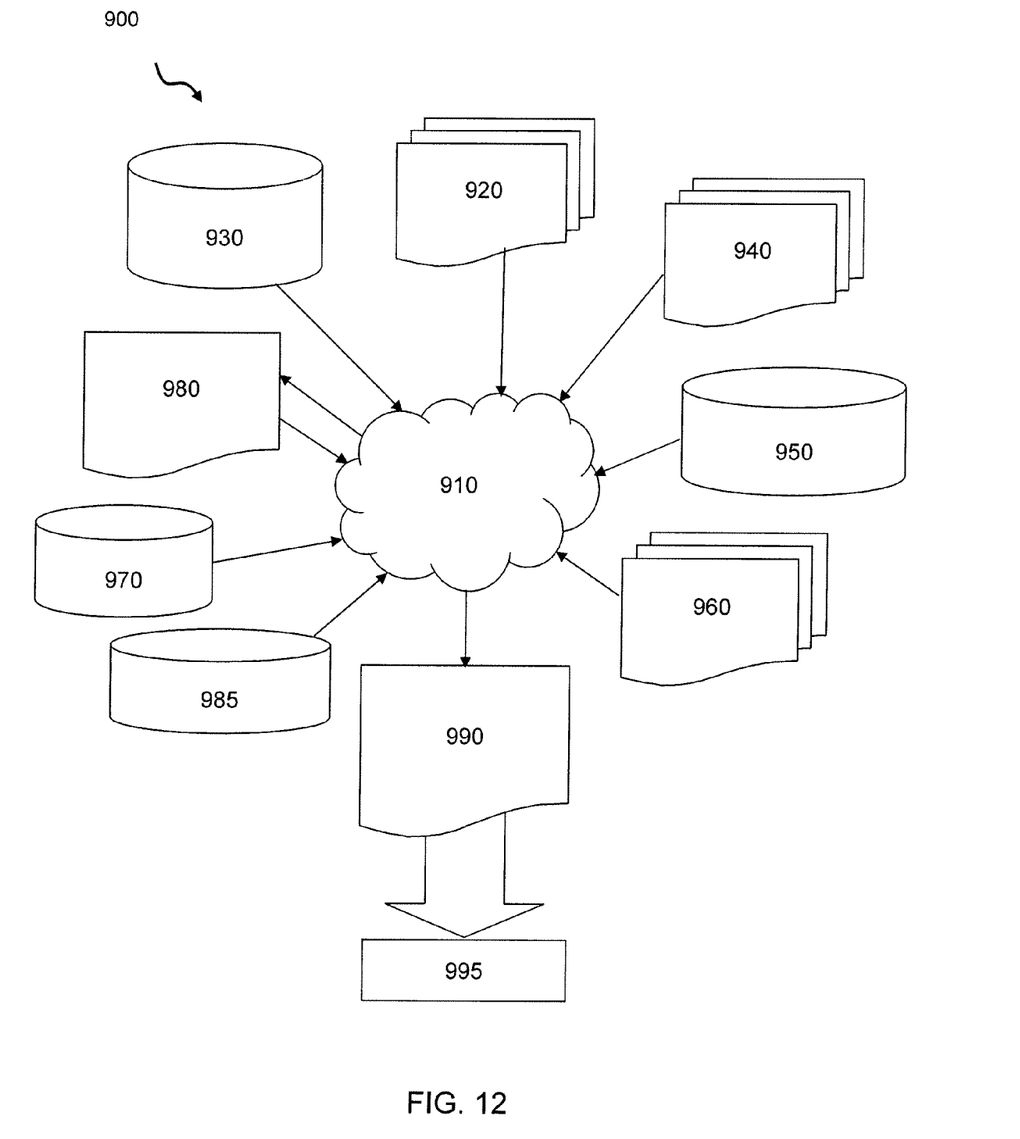
FIG. 12 is a flow diagram of a design process used in semiconductor design, manufacture, and/or test.

FIG. 12 is a flow diagram of a design process used in semiconductor design, manufacture, and/or test. FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-12. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 990 may comprise a compiled, executable HDL simulation model that functionally simulates the devices shown in FIGS. 1-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming an airgap in a wiring level comprising:
   forming adjacent wires in a dielectric layer;
   forming a masking layer coincident with the adjacent wires;
   forming a first layer on the masking layer to reduce a size of an opening formed in the masking layer between the adjacent wires;
   removing exposed portions of the first layer and the dielectric layer to form trenches between the adjacent wires, wherein portions of the dielectric layer remain on sidewalls of the adjacent wires due to masking of the first layer;
   opening the trenches towards the adjacent wires; and
   forming an interlevel dielectric layer upon the dielectric layer, wherein the interlevel dielectric layer is pinched off from filling the trenches so that an airgap is formed between the adjacent wires.

2. The method of claim 1, wherein the opening of the trenches includes removing substantially all of the dielectric layer on the sidewalls within the trenches.

3. The method of claim 1, wherein the trenches are about one half of a minimum ground rule spacing.

4. The method of claim 1, wherein the first layer is one of an organic material and a low temperature oxide.

5. The method of claim 1, wherein the adjacent wires comprise Cu wires.

6. The method of claim 1, wherein the masking comprises a photoresist.

7. The method of claim 1, wherein the masking comprises a hardmask.

8. The method of claim 1, wherein the airgap comprises an intra-level airgap.

9. A method of forming an airgap in a wiring level comprising:
   forming adjacent wires in a dielectric layer;
   forming an inverse masking pattern on the adjacent wires that has a spacing matching a minimum spacing between the adjacent wires;
   forming a first layer on the inverse masking pattern to reduce a size of an opening formed in the masking layer between the adjacent wires;
   forming trenches between the adjacent wires by etching the first layer and the dielectric layer;
   forming a liner on sidewalls of the trenches; and
   forming an interlevel dielectric layer upon the dielectric layer, wherein the interlevel dielectric layer is pinched off from filling the trenches so that an airgap is formed between the liner on the sidewalls.

10. The method of claim 9, wherein the liner is a metal layer.

11. The method of claim 10, wherein the metal layer is deposited using atomic layer deposition processes.

12. The method of claim 10, wherein the metal layer is deposited to a thickness of about 1 nm to about 10 nm.

13. The method of claim 10, wherein the metal layer comprises one of TiN and Ta.

14. The method of claim 10, wherein portions of the dielectric layer remain on sidewalls of the adjacent wires due to masking of the first layer.

15. The method of claim 9, further comprising etching portions of the metal layer using an anisotropic etching process to leave vertical sidewalls.

16. The method of claim 9, wherein the airgaps comprise intra level airgaps.

17. The method of claim 9, wherein the trenches are about one half of a minimum ground rule spacing.

18. The method of claim 9, wherein:
   the first layer comprises one of an organic material and a low temperature oxide;
   the adjacent wires comprise Cu wires; and
   the inverse masking pattern comprises a mask comprising one of a photoresist and hardmask.

19. The method of claim 9, wherein the dielectric layer comprises a low k or ultra low k dielectric.

20. A structure, comprising:
   adjacent wires in a dielectric layer, each of which include a capping layer;
   metal liners formed near sidewalls of the adjacent wires;
   an intra-level airgap formed in the dielectric layer between metal liners; and
   interlevel dielectric layer formed on the dielectric layer, wherein the interlevel dielectric layer is pinched off, which forms the airgap.

21. The structure of claim 20, wherein:
   a portion of the dielectric layer is between the adjacent wires and the metal liners; and
   a portion of the interlevel dielectric layer is between the metal liners and the airgap.

22. The method of claim 1, wherein:
   the masking layer has an inverse masking pattern that is the same width as the adjacent wires;
   spacing between the adjacent wires is the same as the width of the adjacent wires; and
   the first layer is a sacrificial spacer layer comprised of one of an organic material and a low temperature oxide.

23. The method of claim 1, further comprising:
   forming a capping layer on the adjacent wires; and
   forming a second dielectric layer on the capping layer and on exposed portions of the dielectric layer;
   wherein the forming the masking layer coincident with the adjacent wires comprises forming the masking layer on the second dielectric layer.

\* \* \* \* \*